STRAIN GAGE

Filed Aug. 27, 1965

INVENTORS.
ROBERT K. WILLARDSON
HARRY ROBBINS
BY Robert Berliner
ATTORNEY.

1

3,443,167
STRAIN GAGE

Robert K. Willardson, Arcadia, and Harry Robbins, Los Angeles, Calif., assignors to Bell & Howell Company, Chicago, Ill., a corporation of Illinois
Filed Aug. 27, 1965, Ser. No. 483,119
Int. Cl. H01l 3/00, 5/00
U.S. Cl. 317—234 10 Claims

ABSTRACT OF THE DISCLOSURE

A temperature-compensated strain gage of semiconductor material having two regions of the same conductivity type but of opposite-sign resistivity-temperature coefficients. The regions are in parallel electrical relation and act in unison to temperature-compensate the strain gage.

This invention relates to semiconductor devices useful as strain gages.

Semiconductors with large piezoresistive coefficients have been used in strain gages, accelerometers and other force, pressure and strain sensitive transducers. Semiconductor strain gages have very high gage factors, but their gage factors decrease and resistivity characteristics change with increasing temperature. In order to minimize such changes, the semiconductors are excessively doped, resulting in smaller decreases in gage factor with rise in temperature. However, lower gage factors and resistivities also result. In order to recapture high resistance values, very thin gages are used, e.g., having cross sections of about $10^{-6}$ square inches.

One prior art method of obtaining thin gages (e.g., U.S. Patent 3,049,685) is to diffuse doping impurities of one conductivity type into a substrate of the opposite conductivity type to create a p-n junction which, ideally, electrically isolates the substrate from the gaging region (albeit in only one direction). Such devices do not mitigate changes in gage factor and resistivity with increasing temperature. Also, under moderately high temperatures (e.g,, 100-160° C.) or high strain, the p-n junction breaks down. At high temperature, an increased number of carriers tends to reduce the junction barrier and allows current to leak across the junction. Additional carriers are formed with increasing temperature until the conductivity approaches the intrinsic conductivity, (i.e., the conductivity is dependent upon the property of the material itself rather than the impurities which control the conductivity at lower temperatures.) Since the junction properties are essential to the p-n type of semiconductor device, the temperature at which intrinsic conductivity occurs (intrinsic temperature) sets an upper limit for operation of the device. In practice, other considerations further limit the maximum operating temperature so that it may be substantially less than the intrinsic temperature.

An object of the present invention is to provide a semiconductor strain gage which does not suffer the above drawbacks. Another object is to provide such strain gages which are operative at high temperatures without a breakdown of semiconducting properties and which retain high gage factors and resistivities at high temperatures. It is a further object to provide semiconductor strain gages containing more than one active element region, without requiring the use of a p-n junction, and in which more than one of the regions takes part in the electrical process. It is a still further object to provide strain gages which compensate for changes in resistance and gage factors at varying temperatures.

The above objects, and others, are accomplished by providing a strain gage comprising a semiconductor including at least two regions of the same conductivity type and of opposite-sign resistivity-temperature coefficient, and ohmic contacts on said semiconductor.

2

Thus we provide improved strain gages having extended temperature ranges and low resistivity-temperature coefficients by providing for internal compensation of the change in resistance and gage factor with temperature.

The present invention differs in effect from prior art devices in that compensation of temperature effects is achieved and junction leakage is avoided. Our devices differ structurally in that we use at least two strain sensing regions (1) of the same conductiivty type, (2) of opposite-sign resistivity-temperature coefficients and (3) in parallel circuit relationship. Thus, the substrate, rather than isolating the diffused or epitaxially grown region, is an active contributor to the composite gage properties.

Our devices are preferably obtained by providing a heavily doped region on a lightly doped substrate of the same conductivity type but which has an opposite-sign resistivity-temperature coefficient. Such heavily doped region can be provided by a process of the diffusion variety or by the epitaxial growth process, by a combination of both epitaxial growth and diffusion or by any of the well known prior art methods.

The regions may be adjacent, that is abutting each other, or they may be seperated by insulating material such as silicon dioxide, or by a material of opposite conductivity type, and connected in parallel circuit relationship. There may be more than two active regions of the same conductivity type, in which case the resistivity-temperature coefficients of at least two of the regions are of opposite-sign. It is preferred that one of the regions act as a physical support for the other and have a substantially larger cross section area. In this case it is particularly preferred that the supporting region have a negative resistivity-temperature coefficient as the preparation of gages is thereby rendered more facile. This allows for the ready manufacture of simple devices. However, our invention also contemplates devices in which two or more regions are of small cross section area, in which case it may be desirable to dispose the regions on an insulating support or on a support of opposite conductivity type.

In general, an approximation of the magnitude of the resistances and resistivity-temperature coefficients required to achieve a strain gage having an effective resistivity-temperature coefficient approaching 0, can be illustrated by the following calculations with reference to gages having two regions of opposite-sign coefficients.

If C is the conductance, at temperature T, across a strain gage of regions *a* and *b* having individual conductances $C_a$ and $C_b$, respectively, and individual resistances $R_a$ and $R_b$, respectively, then $$dC/dT=dC_a/dT+dC_b/dT$$

For strain gages having a zero resistivity temperature coefficient $$\frac{dC/dT}{C}=0$$

and $$\frac{dC_a/dT}{C_a}=\frac{-dC_b/dT}{C_b}$$

Since $C=1/R$, then $$\frac{-R_a}{R_a^2}\cdot\frac{dR_a}{dT}=\frac{R_b}{R_b^2}\cdot\frac{dR_b}{dT}$$

and therefore $$\frac{R_a}{R_b}=\frac{-dR_a/dT}{dR_b/dT}$$

Thus the ratio of the resistances for regions $a$ and $b$ should approximate the ratio of the resistivity-temperature coefficients $$\frac{dR_a/dT}{R_a}$$

and $$\frac{dR_b/dT}{R_b}$$

for the resistivity-temperature coefficient of the strain gage to approach 0.

It is preferred that the active regions all have resistances across their effective length (the distance between the ohmic contacts) of approximately the same order of magnitude. Thus a first region with a substantially greater cross section area than a second region would preferably have a similarly greater resistivity than the second region. On the other hand, regions with substantially the same cross section areas should preferably have substantially similar resistivity magnitudes (albeit of opposite-sign temperature coefficients).

In referring to resistivity-temperature coefficients of opposite-sign, it is merely required that this relationshp prevail over the test temperature range. Most semiconductor materials exhibit both negative and positive resistivity-temperature coefficients over an extended temperature range. For example, silicon normally used in semiconductor devices, including strain gages, has a negative resistivity-temperature coefficient at liquid nitrogen temperatures, and a positive coefficient at higher temperatures. At the lower temperatures, ionization of the impurity centers in incomplete and the effect of increasing the temperature is to increase the degree of ionization, and thus the concentration of electrical carriers. Increasing the number of carriers with temperature rise confers a negative resistivity-temperature coefficient on the material. At temperatures above 0° C. and below the intrinsic range, the free carrier concentration is independent of temperature for normally used low ionization energy impurities, since the thermal energy of the lattice becomes large in relation to the activation energy of the impurity centers. The predominant operating mechanism in this range of temperatures is the thermal scattering of the electrical carriers; thereby resulting in a decrease in conductance with temperature, i.e., a positive resistivity-temperature coefficient. Increasing the doping concentration and/or using dopants with higher ionization energies can extend the negative coefficient region.

For our purposes, a material designated as having a negative resistivity-temperature coefficient should exhibit such coefficient over the temperature range in which the strain gage is intended to be used. Thus we prefer to employ substrate materials with a low enough concentration (e.g., less than about $10^{18}$ atoms/cms.$^3$) of high ionization energy impurities (e.g., greater than 0.1 electron volt) so that they are not degenerate over the temperature range desired. Such impurity centers are not completely ionized at room temperature and the effect of increasing the temperature is to increase the degree of ionization and thus the concentration of electrical carriers, in domination of thermal scattering.

In general, low ionization energy dopants, less than 0.1 electron volt, can be added to the diffused region at concentrations of $10^{19}$ atoms/cm.$^3$ or higher to impart a positive resistivity-temperature coefficient and such dopants include boron and phosphorus, having about 0.05 electron volt ionization energies.

Dopants having ionization energies of at least 0.15 and generally to about 0.6 electron volt can be used at concentrations of from about $10^{14}$ to about $10^{18}$ atoms/cm.$^3$ to impart a negative resistivity-temperature coefficient to the substrate. Such dopants include gold, indium, thallium, zinc and mixtures thereof.

As noted, doped regions can be provided by well known diffusion or epitaxial growth processes. Another process that can be used to provide a region of negative resistivity-temperature coefficient comprises implanting an element having an ionization energy of at least about 0.15 electron volt in the semiconductor body by impinging an ion of the element onto the surface of the body. Provision of ohmic contacts on the body results in another embodiment of this invention.

The rare earth elements, i.e., having atomic numbers of from 58 to 71, and in particular thulium and neodymium can thus also be incorporated into the semiconductor body. The technique involves impinging high energy ions of the element onto the surface of the silicon, or other semiconducting material used in the invention, which result in the imbedding of such element beneath the surface of the semiconducting material to a depth, for example, of the order of 10,000 angstroms. These techniques have been previously described, but have not heretofore been applied to achieve the results of the present invention. In general, impingement is under vacuum with ion energies on the order of at least about 25 kev., preferably about 150 kev. The substrate temperature can vary from room temperature to about 600° C., or higher. The technique can be used with either type semiconductivity material and we particularly prefer to use it with n-type semiconductivity material.

Light doping of the substrate insures a high gage factor for the substrate portion of the structure. On the other hand, the heavily doped diffused structure has a relatively low gage factor, a negative temperature coefficient of gage factor, and a positive temperature coefficient of resistivity. As the temperature is raised, the increasing resistance of the diffused member is compensated by the decreasing resistance of the substrate, while the decreasing gage factor of the diffused structure is compensated by the increasing contribution of the high gage factor substrate to the properties of the composite structure. By properly selecting the amount and type of doping in the substrate, as well as the relative geometries of the two regions of the composite structure, compensation for temperature changes over an extended range can be achieved. The properties of the diffused structure will be determined almost entirely by the impurities diffused into it, since these will be present in concentrations 10 to 1000 times that of the dopant in the substrate. Thus, the electrical and electro-mechanical properties of the gage regions can be selected independently of each other, and since one has several adjustable parameters (e.g., the doping materials and concentrations in each of the regions, the relative geometries of the regions) at his disposal, it is possible to exercise a considerable degree of control over the composite gage properties.

A typical n-type structure is a heavily doped (at least $10^{18}$ atoms/cm.$^3$) phosphorus diffused layer on lightly ($10^{14}$ to about $10^{17}$ atoms/cm.$^3$) gold doped n-type silicon substrate. A typical p-type structure is a heavily doped boron diffused layer on lightly $10^{14}$ to about $10^{18}$ atoms/cm.$^3$) gold, indium, thallium, or zinc doped p-type silicon substrate.

Gold is an amphoteric impurity that has a donor level lying about 0.35 electron volt above the valence band and an acceptor level lying about 0.54 electron volt below the conducton band, in the forbidden gap of silicon. The donor level is manifested in p-type silicon where it tends to compensate the acceptor impurity at low temperatures. The promotion of electrons from the acceptor levels back into the donor levels as the temperature is raised decreases the degree of compensation and confers the negative resistivity-temperature coefficient on the material. The acceptor level of gold is similarly manifested in n-type silicon, compensating the donors at lower temperatures and returning electrons to the conduction band at higher temperatures to confer a negative resistivity-temperature coefficient. Temperature compensated strain gages can therefore be made from gold doped p-type silicon by means of an acceptor, e.g., boron, diffusion, or from gold doped n-type silicon by means of a donor, e.g., phosphorus, diffusion.

Ohmic contacts are applied to the device to complete fabrication of the gage. The contacts may be applied to only one region or they may span more than one region, e.g., where the regions are separated by an insulating material, or they may overlap more than one region of the same conductivity type.

From the foregoing it is seen that the material of the two regions can be of different origin, e.g., where one is epitaxially grown on the other. In such cases, any semiconductor material with negative resistivity-temperature coefficient can be utilized with material of positive resistivity-temperature coefficient. On the other hand, where only one body of material is utilized, e.g., with a diffused region in a unitary body, then one would utilize as said body only semiconductor material that can exhibit both positive and negative resistivity-temperature coefficients including, but only to the extent that each of the following materials exhibits such property, germanium, silicon, and their alloys, stoichiometric compounds comprised of elements from Group III of the Periodic Table, e.g., gallium, aluminum, indium and elements of Group V, e.g., arsenic, phosphorus, and antimony, and all alloys of semiconductor materials, and includes semiconductor and compound semiconductors known in the art.

Other features and advantages of the present invention will become more readily apparent from the following detailed description and attached drawings wherein.

Figure 2:
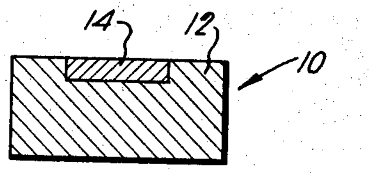
FIG. 2 is a view on line 2—2 of FIG. 1.
Figure 2A:
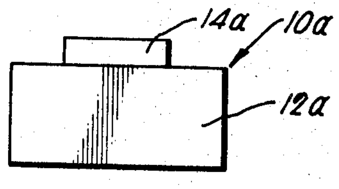
Figure 3:
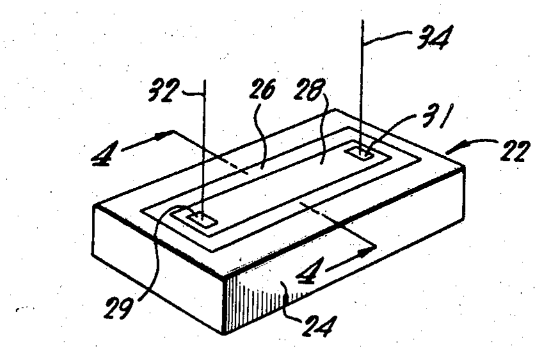
Figure 4:
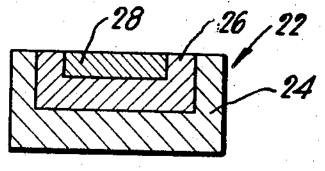
Figure 5:
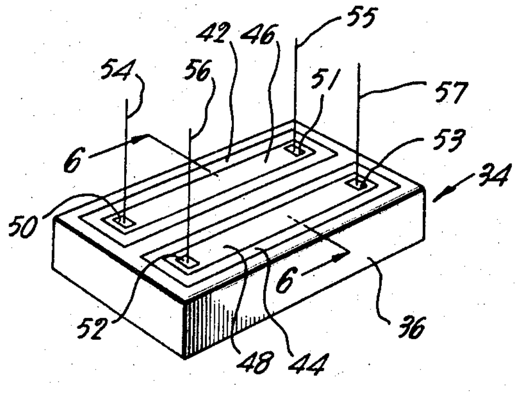
Figure 6:
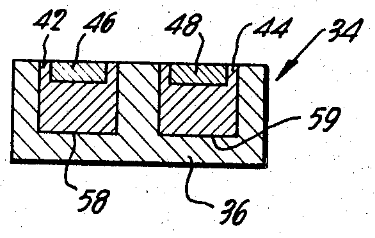

FIG. 2*a* is a front elevation view of an alternative embodiment constructed according to the present invention;

FIG. 3 is a perspective view of an alternative embodiment of the present invention;

FIG. 4 is a view on line 4—4 of FIG. 3;

FIG. 5 is a perspective view of another alternative embodiment of the present invention; and FIG. 6 is a view on line 6—6 of FIG. 5.

Figure 1:
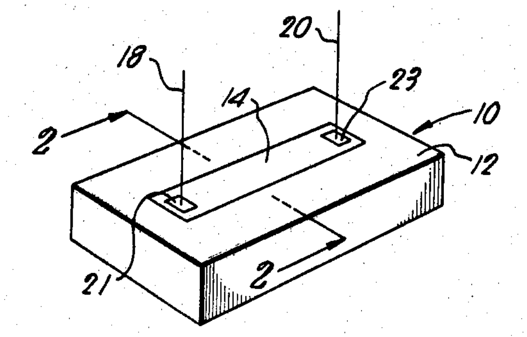
FIG. 1 is a perspective view of a semiconductor strain gage device constructed according to the present invention.

Referring now to FIGS. 1 and 2, the strain gage device 10 includes an elongated semiconductor body 12 and a diffused region 14 disposed thereon. Region 14 is totally contained within the confines of the elongated body 12 and is preferably constructed in this manner, by the diffusion process. However, the gage constructed according to the present invention can perform suitably if the region 14 extends over the entire face and one or more edges of the elongated body 12. Alternatively, as shown in FIG. 2*a*, region **14*a* can be deposited or grown upon the substrate 12*a* of strain gage device 10*a*. In fabricating gage 10*a*, the region 14*a*** is etched from an epitaxial layer growth over the substrate. Techniques for both the epitaxial growth and the masking and etching of the gage region are well known in the art.

The materials chosen for region 14 and body 12 are of the same conductivity type and of opposite-sign resistivity-temperature coefficient, as described above. In this particular illustration, the body 12 is a p-type semiconductor, with a negative resistivity-temperature coefficient, containing about $2\times10^{14}$ atoms/cm.$^3$ of net residual boron acceptors and $10^{17}$ atoms of indium/cm.$^3$. Region 14 is a p-type high conductivity region, with a positive resistivity-temperature coefficient, formed by diffusing $10^{19}$ atoms of boron/cm.$^3$ into body 12. Diffused region 14 has a resistivity of from less than about .001 ohm-centimeter to about .01 ohm-centimeter or more, which is chosen for the type of test to be performed. In this illustration, body 12 has a resistivity such that the resistance across its effective length is of the same magnitude as the resistance across the effective length of region 14. Thus, the ratio of the resistivities of body 12 to region 14 is of the same approximate magnitude as the cross section areas of body

12 to region 14. In this case, region 14 has a resistivity of 0.005 ohm-centimeter, a cross section area of $1\times10^{-6}$ cm.$^2$, and a resistance of 2000 ohms. Body 12 has a resistivity of 0.3 ohm-centimeter, a cross section area of $1.5\times10^{-4}$ cm.$^2$ and a resistance of 2000 ohms.

The body 12 acting as a substrate as well as a strain gage region is fabricated into a configuration which is the best adaptable for the type of application in which it is to be used. The body 12 can generally be cut from a rod with a diamond saw and lapped or etched or both to produce a smooth surface after sawing. Preferably a multitude of gages may be fabricated at the same time on the same ingot or wafer which is cut from the rod.

The ingot or wafer having the outside configuration of the elongated body 12 formed thereon must be oriented with regard to the crystallographic planes, preferably prior to cutting the wafer. As known in the art, it is usual to immerse the semiconductor ingot in a preferential etchant which gives different etch rates in different crystallographic directions. The active etch will develop structural detail in the crystal surface which is used to orient the ingot.

Once the orientation is made, the crystal or rod is cut into slices in such a manner that the required crystal axis lies in a known direction parallel with the surface of the wafer. Once the rod is positioned, it is quite common to cut a plurality of slices at the same time prior to lapping or etching or both in a gang production basis.

Dopants can be added during growth of the ingot or by disposing the elongated body 12 within a diffusion furnace having an atmosphere of the vapor of a doping material as described above. The temperature of the furnace should be in the range of 800° C. to 1350° C. The temperature of the furnace is chosen to add a particular vapor pressure and to achieve the amount of doping required or desired within the elongated body 12. In this particular illustration, $10^{17}$ atoms of indium/cm.$^3$ are thus diffused into the elongated body 12.

The diffused region 14 is then disposed upon the elongated body, and dependent upon the type of material used for region 14, it may be applied by either epitaxial growth or by diffusion of the material into the body. In both the epitaxial growth and diffusion methods it is sometimes desirable to confine region 14 to only a limited area of body 12. In this case, a mask of the desired configuration is deposited on body 12 prior to the deposition or diffusion of region 14. Methods of producing such a mask are known in the art, such as exposure of the surface of body 12 to an oxidizing atmosphere and etching windows in the oxidized surface by means of photoresist techniques and the etching procedure. The windows then allow region 14 to be deposited on a portion of body 12. The mask is aligned to the oriented axis of region 14 in order to gain maximum piezoresistive effect.

The masked wafers are then placed in a diffusion furnace having an atmosphere of the vapor of the doping material, in this case boron. The time and temperature of diffusion, in this case one hour at 900° C., are so chosen to achieve the desired depth of penetration and surface concentration of doping impurities in the substrate body, and these will determine the electrical properties of the diffused region, such as gage factor, temperature and sign of coefficient of gage factor and resistance. In this case, boron is diffused to a concentration of $10^{19}$ atoms/cm.$^3$. When diffusing region 14 within semiconductor body 12, no clear barrier or junction is necessarily formed.

A pair of electrical leads 18, 20 are disposed in spaced relation with each other and are in ohmic electrical contact with diffused region 14. Preferably, a pair of spots 21, 23 are deposited in spaced relation with each other, and may be deposited thereon by the conventional vapor deposition process. Spots 21, 23 may be formed of a material such as aluminum and leads 18, 20 may be gold. One advantage in using spots of material deposited prior to the attachment of the leads is that the distance between the spots may be accurately fixed by a masking and etching technique. Obviously, by moving the spots relative to each other, the resistance "seen" by the leads would necessarily change in relation to the distance between the adjacent edges of the spots.

In alternative embodiments the spots, and consequently the electrical leads, can overlap region 14 onto body 12 or may be located entirely on body 12. Since region 14 and body 12 act in unison to sense strain, the location of the spots in any particular region is not as critical as it would be in prior devices.

Although the illustration used above relates to materials having a p-type conductivity, a similar arrangement can be used for n-type gages. For example, body 12 can be a silicon semiconductor containing about $2 \times 10^{16}$ atoms of phosphorus/cm.$^3$ as net donors, doped with $1.9 \times 10^{16}$ atoms of gold/cm.$^3$, to provide body 12 with a negative resistivity-temperature coefficient. Layer 14 with a positive resistivity-temperature coefficient, can be obtained by diffusion of $10^{19}$ atoms of phosphorus, by the techniques described above.

Referring now to FIGS. 3 and 4, another embodiment of the present invention is illustrated. In this embodiment, the strain gage device 22 has an elongated body or substrate 24 of the same semiconducting material as body 12, with p-type conductivity and a negative resistivity-temperature coefficient, and has a diffused region 26 disposed thereon in the same manner as diffused region 14 is disposed on body 12. Diffused region 26 also has p-type conductivity and a different, but still negative, resistivity-temperature coefficient. In addition, a second diffused region 28, having p-type conductivity but a positive resistivity-temperature cofficient, is disposed entirely within diffused region 26.

In this example, body 24 contains about $2 \times 10^{14}$ atoms/cm.$^3$ of net residual boron acceptors and $10^{17}$ atoms of indium/cm$^3$. Region 26 is formed by diffusing $10^{18}$ atoms of thallium/cm.$^3$ into body 24 through a mask in a manner similar to that disclosed for the diffusion of region 14 into body 12 in FIGS. 1 and 2. Region 28 is obtained by diffusion of $10^{19}$ atoms of boron/cm.$^3$ into region 26, also through a mask.

Metallic ohmic contacts, such as aluminum, 29 and 31, are deposited upon region 28 in spaced relation with each other and a pair of leads, 32 and 34, e.g., of gold, are attached thereto. Thus FIGS. 3 and 4 illustrate a strain gage composed of three p-type layers. A similar structure can be fabricated with three n-type layers.

The entire unit 22 may be affixed to a material to be tested, by an insulating adhesive such as glass frit, epoxy resin, and the like, which material may be placed in tension or compression or any variation of stress-applying test procedures. The particular position of the gage device 22 or 10 with relation to the shape of the material to be tested would naturally be arranged such that the force would be applied to the gage device in the best manner. Other gage devices may be applied to the material to be tested in order to sense more than a strain in one direction or other types of stress.

In operation, the gage device 10 or 22 is connected to the customary Wheatstone bridge and current flows through the leads and the strain gage regions 14 and 12 or 28, 26 and 24. In strain gage device 10, the regions 14 and 12 are in parallel circuit relationship. In strain gage 22, the regions 28, 26 and 24 are all in parallel circuit relationship.

As stress is applied to the material being tested the resistance within the regions will change in proportion to the amount of strain on the gage. Referring to FIGS. 1 and 2, if the material under test is subjected to increasing temperatures the amount of current flowing through region 14 will decrease and the amount of current flowing through body 12 will increase, thereby compensating the decrease in current through region 14. By mere selection of the doping concentrations and geometries of the regions, this compensation can be such that the total change in current occurring through the strain gage as a result of a temperature change will be zero.

Similarly, with reference to FIGS. 3 and 4, as the temperature rises the amount of current flowing through region 28 will decrease while the amount of current flowing through regions 26 and 24 will increase, in compensating amount.

By carefully choosing the parameters as described above temperature compensation can be achieved. A strain gage can be thus obtained whereby any change in resistance values obtained on the Wheatstone bridge is a reflection only of a change in stress applied to the test material, regardless of changes in temperature.

Referring to FIGS. 5 and 6, another embodiment of the present invention is illustrated wherein the gage device 34 includes an elongated body or substrate 36 of insulating material, such as silicon dioxide, or of n-type semiconductivity, with a pair of regions 42, 44 placed in side-by-side arrangements and having generally a rectangular configuration. Regions 42, 44 are of p-type semiconductivity, with negative resistivity-temperature coefficients, and are preferably deposited upon substrate 36 by the diffusion process. A second pair of regions 46, 48, also of n-type semiconductivity, but with positive resistivity-temperature coefficients, are placed in side-by-side arrangements and disposed entirely within their respective diffused regions 42, 44, preferably by the diffusion process.

Metallic ohmic contacts 50, 51 are deposited upon region 46 and ohmic contacts 52, 53 are deposited upon region 48. Electrical leads 54, 55, 56, and 57 are applied to contacts 50, 51, 52 and 53, respectively. in a conventional manner.

A set of p-n junctions 58, 59 is thus formed between the abutting surfaces of regions 42, 44 with substrate 36. These junctions act to electrically isolate regions 42 and 44 from each other and from the material to be tested.

Substrate 36 can be silicon containing about $10^{14}$ atoms of net phosphorus donors/cm.$^3$. Regions 42, 44 can be obtained by diffusion of $10^{17}$ atoms of thallium/cm.$^3$ into region 36 by a masking procedure as above. Regions 46, 48 can be obtained by diffusing $10^{19}$ atoms of boron/cm.$^3$, through a mask into regions 42, 44.

In operation, the gage device 34 is connected to the customary Wheatstone bridge, using regions 42, 46 and 44, 48 as two legs thereof. As stress is applied to the material being tested, the resistance within the strain gage regions 42, 46 and 44, 48 will change in proportion to the amount of strain in the gage region. The junctions 58, 59 prevent the flow of electrons through the substrate 36 and acts as an isolating barrier.

As the ambient temperature changes, the resistance across regions 42, 44 increases and the gage factor decreases, but are compensated by a corresponding decrease in resistance and increase in contribution of high gage factor across regions 46, 48 resulting in a reduction or no change in resistance or gage factor due to change in temperature.

Other materials can be substituted for those used in the above illustrations, thus III–V compound semiconductors can be used in place of the silicon used above. Likewise, indium, thallium, boron, zinc, (and other dopants) or combinations thereof, can be used as doping impurities in the p-type structures described.

Other changes may be made by one skilled in the art without departing from the spirit of the present invention.

We claim:

1. A strain gage comprising:

a semiconductor body having a negative resistivity-temperature coefficient and containing from about $10^{14}$ to about $10^{18}$ atoms/cm.$^3$ of a dopant having an ionization energy of at least about 0.15 electron volt.

a diffused region thereon of the same conductivity type and having a positive resistivity-temperature coefficient, containing at least about $10^{18}$ atoms/cm.$^3$ of a dopant having an ionization energy of less than about 0.1 electron volt, said region and said body being in parallel electrical relation, and ohmic contacts disposed thereon, said semiconductor body and diffused region being capable of acting in unison to temperature-compensate said strain gage.

2. A strain gage comprising:

a p-type silicon semiconductor body containing from about $10^{14}$ to about $10^{18}$ atoms/cm.$^3$ of an element selected from gold, indium, thallium and zinc, and combinations thereof, a p-type diffused region thereon containing at least about $10^{18}$ atoms of the acceptor type having an ionization energy of less than about 0.1 electron volt, said region and said body being in parallel electrical relation, and ohmic contacts disposed thereon, said semiconductor body and diffused region being capable of acting in unison to temperature-compensate said strain gage.

3. A strain gage comprising:

an n-type silicon semiconductor body containing from about $10^{14}$ to about $10^{17}$ atoms/cm.$^3$ of gold, a diffused region thereon containing at least about $10^{18}$ atoms of the donor type having an ionization energy of less than about 0.1 electron volt, said region and said body being in parallel electrical relation, and ohmic contacts disposed thereon, said semiconductor body and diffused region being capable of acting in unison to temperature-compensate said strain gage.

4. The strain gage of claim 1 wherein said ohmic contacts are mounted entirely within the area of said diffused region.

5. A strain gage comprising:

an n-type silicon semiconductor body containing from about $10^{14}$ to about $10^{18}$ atoms/cm.$^3$ of an element selected from those elements having an atomic number of from 58 to 71 and combinations thereof, an n-type region thereon containing at least about $10^{18}$ atoms of the acceptor type having an ionization energy of less than about 0.1 electron volt, said region and said body being in parallel electrical relation, and ohmic contacts disposed thereon, said semiconductor body and region being capable of acting in unison to temperature-compensate said strain gage.

6. A strain gage comprising:

a semiconductor body having a negative resistivity-temperature coefficient and containing from about $10^{14}$ to about $10^{18}$ atoms/cm.$^3$ of a first dopant having an ionization energy of at least about 0.15 electron volt, a region thereon of the same conductivity type and having a positive resistivity-temperature coefficient, containing at least about $10^{18}$ atoms/cm.$^3$ of a second dopant having an ionization energy of less than about 0.1 electron volt, said region and said body being in parallel electrical relation, and ohmic contacts disposed thereon, said semiconductor body and region being capable of acting in unison to temperature-compensate said strain gage.

7. The strain gage of claim 6 wherein said ohmic contacts are disposed entirely within said region.

8. The strain gage of claim 6 wherein said region is an epitaxially formed region.

9. The strain gage of claim 6 wherein said semiconductor body is p-type silicon, said first dopant is an element selected from gold, indium, thallium and zinc, and combinations thereof, and said second dopant is of the acceptor type whereby said region is of p-type conductivity.

10. The strain gage of claim 6 wherein said semiconductor body is n-type silicon, said first dopant is gold and is present to the extent of from about $10^{14}$ to about $10^{17}$ atoms of gold per cm.$^3$ of silicon, and said second dopant is of the donor type whereby said region is of n-type conductivity.

References Cited

UNITED STATES PATENTS 3,049,685 8/1962 Wright -------------- 338—2

3,277,698 10/1966 Mason ------------- 73—88.5

OTHER REFERENCES

Conwell, Properties of Germanium and Silicon Proc. Institute of Radio Engineers, 46 (1958).

JOHN W. HUCKERT, *Primary Examiner.*

M. EDLOW, *Assistant Examiner.*

U.S. Cl. X.R.

317—235